United States Patent [19]
Collins et al.

[11] Patent Number: 5,363,397
[45] Date of Patent: Nov. 8, 1994

[54] INTEGRATED SHORT CAVITY LASER WITH BRAGG MIRRORS

[75] Inventors: Reuben T. Collins, Yorktown Heights; Sandip Tiwari, Ossining, both of N.Y.

[73] Assignee: Internatioal Business Machines Corporation, Armonk, N.Y.

[21] Appl. No.: 968,109

[22] Filed: Oct. 29, 1992

[51] Int. Cl.$^5$ .......................... H01S 3/06; H01S 3/08; G02B 6/42
[52] U.S. Cl. ......................... 372/92; 372/43; 372/48; 385/14; 385/49; 385/88; 385/89
[58] Field of Search ........................ 385/14, 49, 88, 89; 372/92, 99, 96, 49, 43

[56] References Cited

U.S. PATENT DOCUMENTS

| | | | |
|---|---|---|---|
| 4,466,696 | 8/1984 | Carney | 385/49 |
| 4,603,420 | 7/1986 | Nishizawa et al. | 372/46 |
| 4,675,875 | 6/1987 | Takamiya . | |
| 4,951,291 | 8/1990 | Miyauchi et al. | 372/49 |
| 4,999,843 | 3/1991 | Luryi et al. . | |
| 5,020,066 | 5/1991 | Iga et al. . | |
| 5,034,958 | 7/1991 | Kwon et al. . | |
| 5,063,569 | 11/1991 | Xie . | |
| 5,068,869 | 11/1991 | Wang et al. . | |
| 5,285,468 | 2/1994 | Ackerman et al. | 372/96 |

OTHER PUBLICATIONS

L. Balliet et al., "Self–Aligning Edge Emitter for Fiber Optics" IBM Technical Disclosure Bulletin, vol. 23, No. 7B Dec. 1980.
P. Zhou, et al. "Low Series Resistance High–Efficiency GaAs/AlGaAs Vertical–Cavity . . . " IEEE Photonics Technology Letters, vol. 3, No. 7, Jul., 1991, pp. 591–593.
A. Ibaraki et al., "GaAs Buried Heterostructure Vertical Cavity Top–Surface Emitting . . . " IEEE Journal of Quantum Electronics, vol. 27, No. 6, Jun. 1991, pp. 1386–1390.
H–J. Yoo et al., "Low Series Resistance Vertical–Cavity Front–Surface–Emitting Laser . . . " Appl. Phys. Lett. 56(20), May 14, 1990, pp. 1942–1944.
M. Sugimoto et al., "Very Low Threshold Current Density In Vertical–Cavity Surface . . . " Electronics Letters, Feb. 13, 1992, vol. 28, No. 4, pp. 385–387.
C. A. Beyler et al., "Low Threshold Current Lateral Injection Lasers On Semi–Insulating . . . " Electronics Letters Jul. 18, 1992, vol. 27, No. 15, pp. 1372–1374.

*Primary Examiner*—Rodney B. Bovernick
*Assistant Examiner*—Robert McNutt
*Attorney, Agent, or Firm*—Robert M. Trepp; Ronald L. Drumheller

[57] ABSTRACT

An edge emitting laser combines many of the desirable attributes of the common forms of surface-emitting and edge-emitting laser structures together with elimination of their drawbacks. The laser cavity of a device according to the present invention is short (on the order of the tile wavelength of light in the cavity medium) and current is injected into the optical cavity substantially perpendicular to the plane of emitted light and parallel to the plane of reflective mirrors. The use of a short optical cavity permits single mode laser operation because of broad mode to mode spacing and large changes in reflectivity between wavelengths. Injecting current into the cavity perpendicular to the direction of light emission provides low power operation because the resistance associated with the injected current is low. The resistance is low because current does not cross boundaries between the different material layers forming the reflective mirrors and the optical cavity. A groove in the semiconductor substrate is formed which aligns an optical fiber to one edge of the laser device. The formation of an optical device incorporating this laser structure is inexpensive to manufacture because the laser is based on planar semiconductor fabrication techniques and the optical alignment of an optical fiber to the laser has been defined by the groove adjacent the laser device.

17 Claims, 5 Drawing Sheets

INTEGRATED SHORT CAVITY LASER WITH BRAGG MIRRORS

FIELD OF THE INVENTION

This invention relates, generally, to electrically pumped semiconductor lasers. More particularly, this invention relates to edge emitting electrically pumped semiconductor lasers. Specifically, this invention relates to short cavity edge entitling semiconductor lasers.

BACKGROUND OF THE INVENTION

Semiconductor laser devices are particularly useful for transmitting information in the form of light pulses or intensity-modulated light along optical fibers. The desirability of transmitting information by light is directly attributable to the large bandwidths, i.e., the large amount, at large speeds (only fractions smaller than speed of light in vacuum) that can be transmitted compared to that using electrical signals. Electrical signals are inherently limited in frequency and speed due to electrical loading, mainly due to capacitive effects, and limitations on design of device drivers due to needs of conserving power. In order to take advantage of the increased performance offered by light transmission systems, small and efficient laser structures must be developed which can transmit the light reliably and cheaply.

Laser structures which have been built in the prior art to accomplish the goals described above fall roughly into two categories. One category of lasers emits light normal to the surface of a semiconductor wafer. The light emitted from these surface emitting type structures is focused into an optical fiber which must be aligned normal to the surface of the semiconductor wafer or the light must be reflected in the direction desired. The mechanical alignment of the optical fiber to the surface emitting laser is a difficult task to accomplish cheaply and reliably.

In addition, most surface emitting lasers have current injected into tile optical cavity of the device through the same material layers through which light is emitted. Such surface-emitting lasers have a layer structure requiring high reflectivity mirrors, which are by necessity periodically varying quarter-wave layers of materials with different indexes of refraction. The interfaces between such layers are generally abrupt and have high resistance to motion of carriers. This leads in turn to high resistance for current injection into the optical cavity and hence high power dissipation. The increased use of power places many limitations, such as decreased use with other low power electronic devices, on the utility of these lasers. Although, the surface emitting laser has many technical problems, the surface emitting laser has several significant advantages, such as low threshold current due to the use of a small active gain volume of the optical cavity together with high reflectivity and low optical loss mirrors, low divergence angle of emitted light due to the use of broad dimensions, and single-mode operation due to broad mode-to-mode spacing and large changes in reflectivity between the mode wavelengths. Moreover, the surface emitting lasers can be built using conventional semiconductor techniques which are well understood and form the basis for an inexpensive device.

Another category of semiconductor laser is an edge emitting semiconductor laser. In this type of device, multiple layers of materials are grown on a substrate which will later form the laser device. In the most common form, the laser device is actually formed by cleaving out an optical cavity from the substrate. The cleaved edges of the optical cavity generally have sufficient reflectivity to permit the lasing action to occur. The reflectivity of the cleaved surfaces can be enhanced through the deposition of mirrors or complex Bragg reflectors onto the cleaved surfaces. The problem with this edge emitting device is that the mode spacings are short because of the use of a large optical cavity, leading to multi-mode operation and a larger threshold current due to the use of a larger active-gain volume in the optical cavity. In addition, once the optical cavity has been cleaved from the substrate, the subsequent processing of the laser device becomes very labor intensive and therefore expensive. The edge emitting device which has a long optical cavity typically has large power dissipation because of the long cavity. Again, as in the surface emitting device, a large power dissipation is a significant shortcoming of the device. Moreover, it is difficult to integrate the cleaved laser with other microelectronic structures to manufacture an inexpensive information processing system. In general, neither of the common forms of the surface emitting lasers or the edge emitting lasers built to date, possess the optical and electrical properties necessary for optimal electronic communication and/or low manufacturing costs necessary for the integration of laser technology into digital communication.

OBJECTS OF THE INVENTION

It is an object of the present invention to manufacture an improved laser structure for use in an optical communication system.

It is another object of the present invention to manufacture an inexpensive laser structure for use in an optical communication system.

It is a further object of the present invention to manufacture a semiconductor laser structure which can be integrated with microelectronic structures for use in an optical communication system.

It is still another object of the present invention to manufacture a laser structure which can be inexpensively and reliably aligned to an optical fiber for use in an optical communication system.

It is still a further object of the present invention to manufacture a semiconductor laser structure which has low power dissipation and high performance with single mode operation.

SUMMARY OF THE INVENTION

The present invention is an edge emitting laser which combines many of the desirable attributes of the common forms of surface-emitting and edge-emitting laser structures together with elimination of their drawbacks. The laser cavity of a device according to the present invention is short (on the order of the the wavelength of light in the cavity medium) and current is injected into the optical cavity substantially perpendicular to the plane of emitted light and parallel to the plane of reflective mirrors. The use of a short optical cavity permits single mode laser operation because of broad mode to mode spacing and large changes in reflectivity between wavelengths. Injecting current into the cavity perpendicular to the direction of light emission provides low power operation because the resistance associated with the injected current is low. The resistance is low because current does not cross boundaries between the different material layers forming the reflective mirrors and the optical cavity. In particular, the laser of the present invention is a p-i-n structure formed by conventional semiconductor processing means on a substrate. An intrinsic semiconductor layer is horizontally sandwiched between a highly doped p layer and a highly doped n layer on a substrate. Light emitting facet edges are etched vertically into the p-i-n structure. The facet edges are oppositely facing vertical (with respect to the horizontal intrinsic semiconductor layer) structures which are separated by a distance of less than approximately 10 times the wavelength of the emitted light. The vertical etching process, which forms the facet edges, etches through an upper conductive layer (such as a highly doped n layer) and through the intrinsic layer of the p-i-n structure. The vertical etching does not etch entirely through the lower conductive layer (such as a highly doped p layer). The vertical etching process forms the vertical sidewalls of the optical cavity which is a mesa structure having a conductive layer at the bottom and an intrinsic layer and upper conductive layer as a pedestal part of the mesa structure. The vertical facets of the laser structure are coated with Bragg reflectors. The Bragg reflectors are deposited on the vertical surfaces of the laser cavity through conventional chemical vapor deposition or alternative means such as evaporation, sputtering, or ion-beam assisted deposition. Contact to the conductive n-type and p-type areas of the p-i-n structure are added and current can be passed through the p-i-n structure. Current is passed through the intrinsic part of the p-i-n structure substantially perpendicular to the direction of emitted light from the laser structure. A groove in the semiconductor substrate is etched which aligns an optical fiber to one edge of the laser device. This laser structure is inexpensively manufactured because it relies on conventional planar semiconductor manufacturing techniques. This laser structure does not consume substantial power because the cavity is short and the current injected into the cavity is injected through highly conductive p and n type areas perpendicular to the direction of emitted light. Moreover, an optical structure incorporating the laser device is inexpensive to manufacture because the optical alignment of an optical fiber to the laser has been defined by the groove adjacent the laser device.

DESCRIPTION OF THE PREFERRED EMBODIMENT

Figure 1:
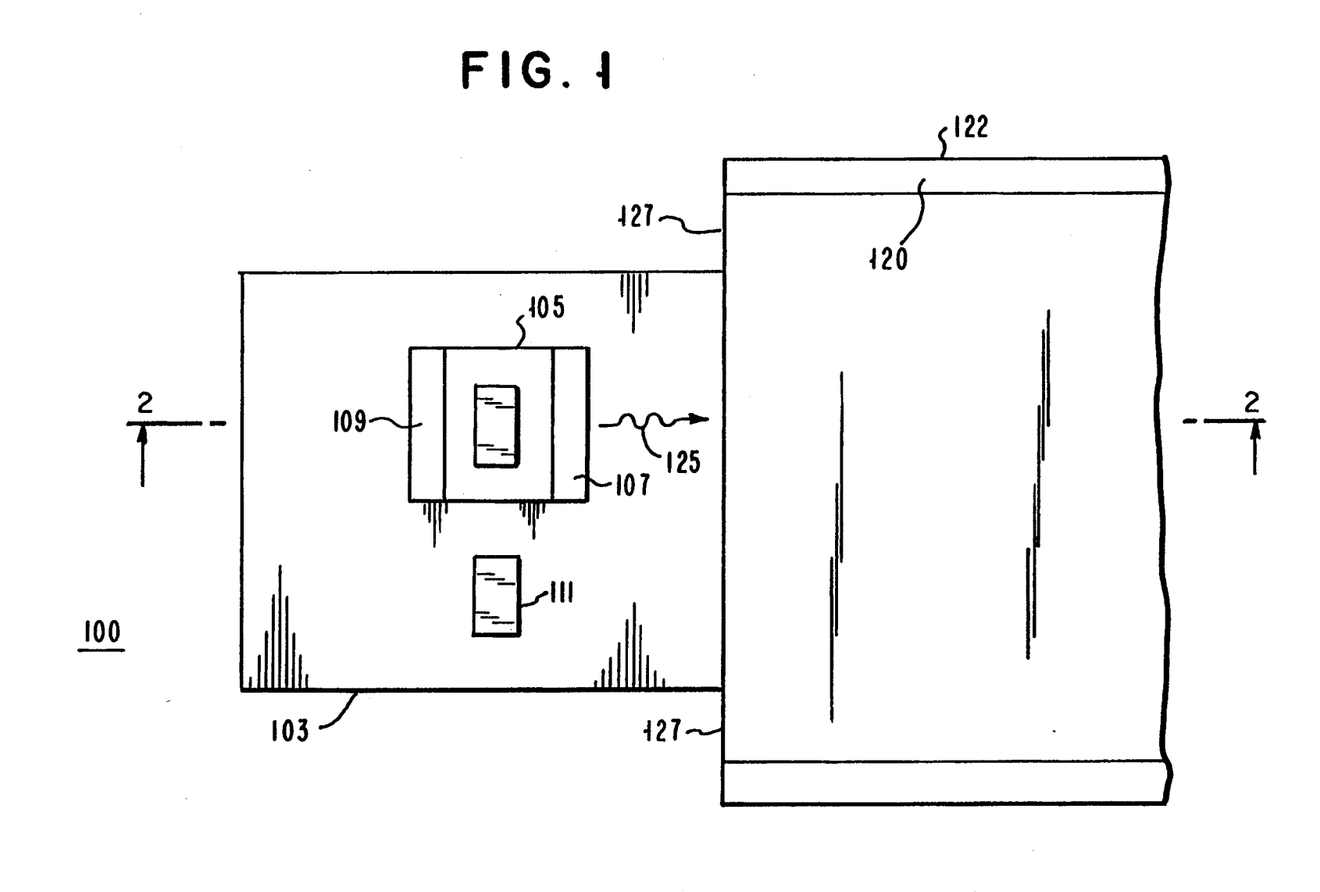
FIG. 1 illustrates a top view of a laser structure according to the present invention.

FIG. 1 illustrates a top view of a first embodiment of the present invention, In particular, an optical fiber 120 is placed in a groove 122 which is aligned to a semiconductor laser according to the present invention. The semiconductor laser is comprised of a mesa 105 in a device area 103 formed in a substrate 100. The semiconductor laser comprises Bragg reflectors 107 and 109, n contact 113 (which can be self aligned to the mesa 105) and p contact 111. Light 125 is emitted through the Bragg reflector 107 and incident on optical fiber 120 which is closely aligned to the mesa structure by lithography. Light 125 has been emitted normal to the surface of Bragg reflector 107. The semiconductor laser structure and the groove 122 are formed in a substrate 100. The optical fiber 120 and the semiconductor laser structure lie at least partially below the surface of the substrate 100 and the optical fiber may lie further below the surface of the substrate than the laser structure. The substrate 100 of this embodiment of the present invention is formed from InP based compounds. A laser based on such a material emits light having a long wavelength, for example, on the order of 1.3 to 1.6 microns. Another embodiment of the present invention can be formed on other types of substrate materials such as GaAs. These embodiments would emit light having a different wavelength, for example in the 0.8 to 0.9 micron range for GaAs.

Figure 2:
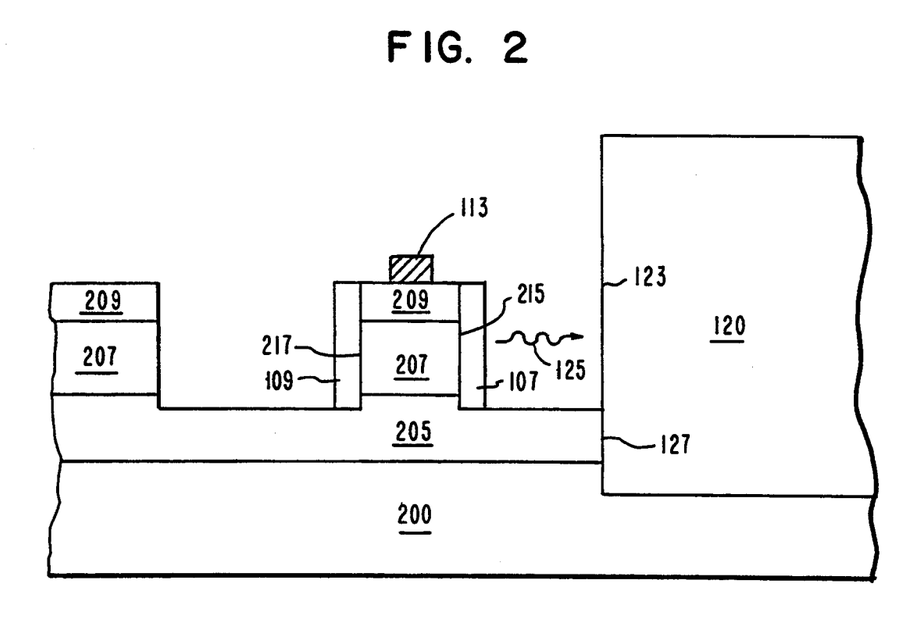
FIG. 2 illustrates a cross section of a laser structure according to the present invention.

FIG. 2 illustrates a cross section of the semiconductor laser according to the present invention as seen along view 2—2 illustrated in FIG. 1. The semiconductor laser of FIG. 2 is built upon an indium phosphide substrate 200. Layer 205 is formed over layer 200. Layer 205 is a heavily doped p+ region formed from indium phosphide or aluminum indium arsenide ($Al_{0.48}In_{0.52}As$) when the substrate layer 200 is InP. When the substrate material is GaAs, gallium aluminum arsenide (GaAlAs) is suitable for layer 205. The material of layer 205 is chosen to have a lattice structure closely matched to the substrate material and to provide optical confinement. For InP substrates, a material layer formed of $Al_{0.48}In_{0.52}As$ has a matching lattice structure. For GaAs, a material layer formed of GaAlAs (of all Al-As mole fractions) has a matching lattice structure. Layer 205 also has a larger bandgap and a lower refractive index than the active intrinsic (i) region 207 formed over layer 205. The p type doping concentration in layer 205 is greater than approximately $5 \times 10^{18}/cm^3$. The substrate 200 has a thickness of between 2 and 25 mils and layer 205 has a thickness which is greater than or approximately equal to 0.5 microns.

Figure 5:
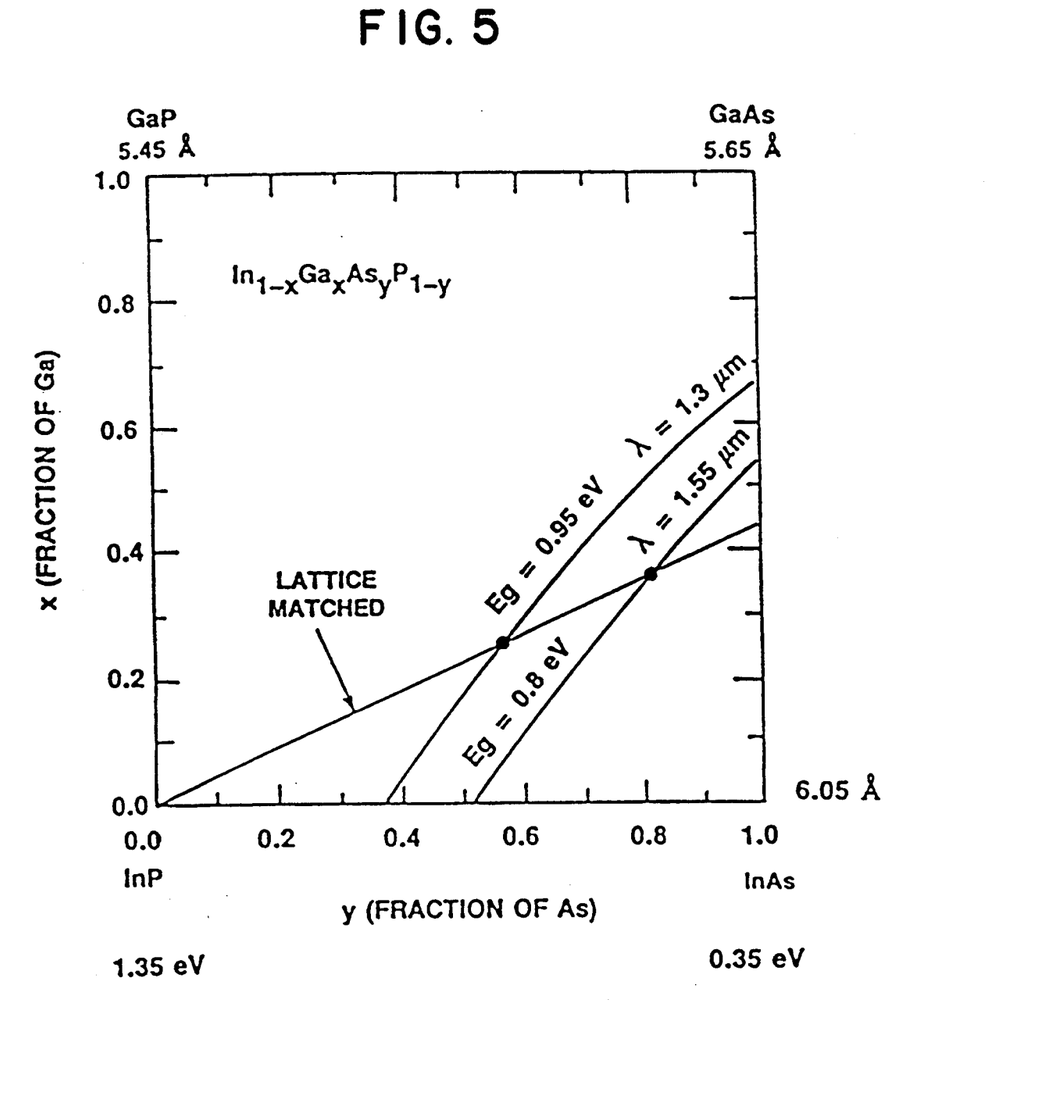
FIG. 5 illustrates the compositional dependence of light wavelength on mole fraction for compounds of gallium-indium-arsenide-phosphide.

Layer 207 forms the optical cavity of the semiconductor laser device. Layer 207 is grown on top of layer 205. Layer 207 is formed of gallium indium arsenide phosphide which is doped either lightly p type or lightly n type or left intrinsic. The mole fractions of gallium indium arsenide phosphide are chosen to select a wavelength commensurate with lattice matched growth as shown in FIG. 5. Lightly-doped optical cavities allow for lower resistance at low bias conditions leading to more efficient operation near threshold conditions. It also allows transparency to be achieved at lower power dissipation. Light p-type doping also allows for more efficient operation due to higher differential gain resulting from availability of direct recombination states in the valence band. Layer 207 has a preferable thickness of approximately one hundred angstroms to five microns. In other embodiments, quantum-well and graded index regions can also be incorporated, into layer 207. Once the optical cavity layer 207 has been formed, a final layer 209 is formed on top of the optical cavity region 207. Layer 209 is a heavily doped n type region formed from aluminum indium arsenide ($Al_{0.48}In_{0.52}As$) or indium phosphide. Layer 209 has a doping concentration of greater than or equal to approximately $5\times10^{18}/cm^3$ and is greater than approximately 0.5 microns thick. Layer 209 may also have a special ohmic contact layer grown on top of it. A gallium indium arsenide layer of varying composition (and therefore strained) which is heavily doped and high in indium arsenide mole fraction at the surface, is one example of this type of contact layer structure. When the substrate is GaAs, layers 207 and 209 are typically GaAlAs layers with AlAs mole fractions of 0.30 or larger.

After layers 205, 207 and 209 have been deposited, the facet edges of the semiconductor laser structure are defined. The facet edges 215 and 217 are etched into the material stack consisting of layers 207 and 209 by chemical-assisted ion beam etching and/or electron-cyclotron etching, both of which are used at small bias levels to minimize surface damage. Some possible gases and combinations for different materials are: (a) GaAs—CH4 diluted in H2, Cl2, CCl2F2 diluted in Ar, or BCl3, (b) InP—CH4 diluted in H2, Cl2, BCl3, or HCl, (c) GaInAs—CH4 diluted in H2, or Cl2, and for (d) AlInAs—CH4 diluted in H2, or Cl2. The layer 205 needs to be only partially etched to assure isolation and layer 200 is not etched. This stopping of etching on layer 205 is achieved by etch selectivity to this material or by tinting the etch. Once the facet edges 215 and 217 have been defined, Bragg reflectors 107 and 109 are formed on the facet edges. The Bragg reflectors 107 and 109 are combinations of insulating material layers which provide a high reflectivity at the edges 215 and 217. The reflectors are typically formed of several quarter wave periods of material layers which together form a quarter wave stack. When a semiconductor type material is chosen for a quarter wave stack, it is deposited by a deposition technique such as chemical vapor deposition using metal-organics. If all insulating dielectric type material is chosen, it can be evaporated, sputtered, or deposited using one of the several ion-assisted techniques. When the embodiment uses a GaAs substrate, the semiconductor mirror consists of alternating periodic quarter wave stacks of gallium aluminum arsenide of different aluminum mole fractions that are chosen to result in large index of refraction discontinuity as well as minimal absorption.

When tile embodiment uses an InP substrate, the reflective mirrors are periodic quarter wave stacks of aluminum indium arsenide and InP. For low surface recombination velocity materials, such as those grown on InP substrates, deposited dielectric insulators such as aluminum oxide, silicon oxide, amorphous silicon, tantalum oxide, or hafnium oxide, are suitable. Such materials allow for large index of refraction changes, and yet can be deposited by very straightforward deposition techniques with good control of thickness. The number of periods of material layers in a quarter wave stack is typically 10 to 20 periods, which results in a typical total reflector thickness of approximately 5 microns. The Bragg reflectors are deposited on facets 215 and 217 by orienting the substrate at an angle with respect to the flow of material from a particular deposition technique. For example, when tantalum oxide is sputtered/evaporated onto facet 215, the substrate is oriented such that the sputtered/evaporated flow of tantalum oxide strikes the surface of the substrate at a shallow angle of 0.5 to 20 degrees, preferably, 1.5 degrees, with facet 215 facing the sputtered/evaporated material flow. The same type of orientation is used for depositing material on facet 217 except that the substrate is oriented with facet 217 facing the sputtered/evaporated material flow.

A p type contact is formed on layer 205 spaced apart from Bragg reflector 109. An n type contact 113 is also formed on layer 209. Some examples of metallurgies suitable for n-type contacts in this process are composite layers of AuGe, Ni, and Au; or AuGe, Ag, and Au; or AuGe, Ni, Ag, Au; alloyed between 360° and 500° C. Also suitable are composites of W and In, Ni and In, or MoGe2 sintered at >700 Celsius, or additionally an epitaxially grown InAs or GaInAs based ohmic contact employing a refractory metallurgy. Suitable p-type contacts for this process are, for example, AuZn, AuBe, AgZn, AgBe evaporated and alloyed at 300°-500° C. Open or closed tube diffusion of Zn followed by a contact metal. Also a W(Zn) contact utilizing diffusion at 600°-800° C. can be formed. Implantation of p-type species together with Ti, Ti-Pt, Pt, or other refractory metallurgy or direct deposition of Pt, Ti-Pt, Ti on p-type grown region is yet another P contact formation process suitable for this process.

Finally, after the contact layers have been formed, the optical fiber 120 is placed into groove 122 with a receiving end surface 123 of the optical fiber being parallel and facing the Bragg reflector 107 and being normal to the direction of the light being received from the Bragg reflector 107. The groove 122 is etched separately from the facet edges 215 and 217. The optical fiber 120 is typically much larger than the laser structure and so the groove 122 is generally deeper and wider than the facet edges so that the laser structure generally emits light into the center of the optical fiber. The groove is typically formed, using lithographic alignment, by employing anisotropic etching. For these grooves, on a (100) substrate, the preferred orientation of the groove is along the $<01\bar{1}>$ direction. An anisotropic etch process such as those based on HCl and hydrogen peroxide or ammonium hydroxide and hydrogen peroxide is the preferred etching process. The edge of the groove 127 which abuts to the optical fiber receiving end 123 is typically formed within approximately 1-5 microns of the outer edge of the Bragg reflector 107. The edge of the groove 127 can be formed at distances greater than 5 microns from Bragg reflector 107, but larger distances reduce the light coupled into the optical fiber and so the groove 127 is generally formed within approximately 25 microns of Bragg reflector 107.

The p+ region 205, in combination with the intrinsic region 207 and the n+ region 209, form a p-i-n structure in which current is controlled through the contact 111 and 113. In particular, the p-i-n junction is forward biased by applying a positive voltage to contact 111 with respect to contact 113 which allows current to flow through layers 205, 207 and 209 respectively. The current flowing through the p-i-n junction electrically pumps a laser structure. As a result of the electrical current flowing through the p-i-n junction, direct recombination occurs in layer 207, and because of the low-loss mirrors on facets 215 and 217, and the light confinement due to index of refraction changes of layers 209 and 205, light is emitted from the facet edges 215 and 217 of the optical cavity. The light emitted from the edges 215 and 217 is emitted in a parallel direction to the plane of layers 205 and normal to the plane of facet edges 215 and 217. The light which is emitted from tile optical cavity strikes the Bragg reflectors 107 and 109 and a significant fi-action is reflected because of the high-reflectivity mirrors. High gains in the active region and tile low loss of the mirrors allows for lasing to occur and coherent light 125 is emitted from the Bragg reflectors 107 and 109. One can preferentially accentuate the intensity emitted across one facet, by increasing reflectivity of the other facet. This is accomplished, for example, by using larger number of periods for quarter wave stacks on one facet than the other. The cavity should be designed to be a multiple of half of the wavelength of light in the cavity in order to maintain efficient operation. In particular, in order to produce single wavelength emission, tile length of tile optical cavity must not exceed 10 times the wavelength of light in the cavity. Preferably, the cavity length (spacing from facet 215 to 217) is approximately 1–5 microns. The width of the cavity is generally on the order of 2–25 microns.

Creating optical cavities of such a short length by conventional cleaving methods is difficult, if not impossible, because of the mechanical limitations associated with tile cleaving process. Additionally, the cavity of the present invention has optical modes which are far apart in frequency. This results in single mode operation of the laser. Moreover, as explained above, the distance between the edge of the Bragg reflector 107 and the receiving end of the optical fiber 123 is small, preferably in the range of 1–5 microns, and determined by lithography. As a result, the coupling of light beam 125 to the optical fiber is very efficient, even for single mode optical fibers. The efficient coupling of the optical fiber to the single mode laser structure decreases the amount of light energy that must be produced by the laser to transmit signals through the optical fiber. Decreasing the amount of light energy required to transmit signals reduces the power which is required by the laser.

The efficient injection of carriers through the p+ and n+ regions into the intrinsic region, without the transport of carriers across the Bragg reflectors as in prior art devices, allows the laser to be operated at low currents and low bias voltages which also translates into low power laser operation. The power required from the laser is reduced because the heavy doping of the p+ layer 205 and the n+ layer 209 significantly reduce the resistance that the current through the p-i-n junction is exposed to. The low resistance of the p-i-n junction is possible in the present embodiment of the invention because current is injected into the optical cavity in a direction normal o the direction of the light which is emitted and substantially parallel to tire planes of the Bragg reflectors. Injection of current carriers parallel to the Bragg reflectors means that current carriers do not cross boundary layers between different materials forming quarter wave stacks. This leads to significantly lower resistance than in conventional vertical expitaxy short cavity laser structures in which current is injected into the optical cavity through a plane in parallel with the emitted light. The low power operation of the present device makes the device suitable for operation with other low powered electronic devices fabricated on the same substrate. Further, low power operation facilitates the integration of many laser devices in an optical communication device.

Figure 3:
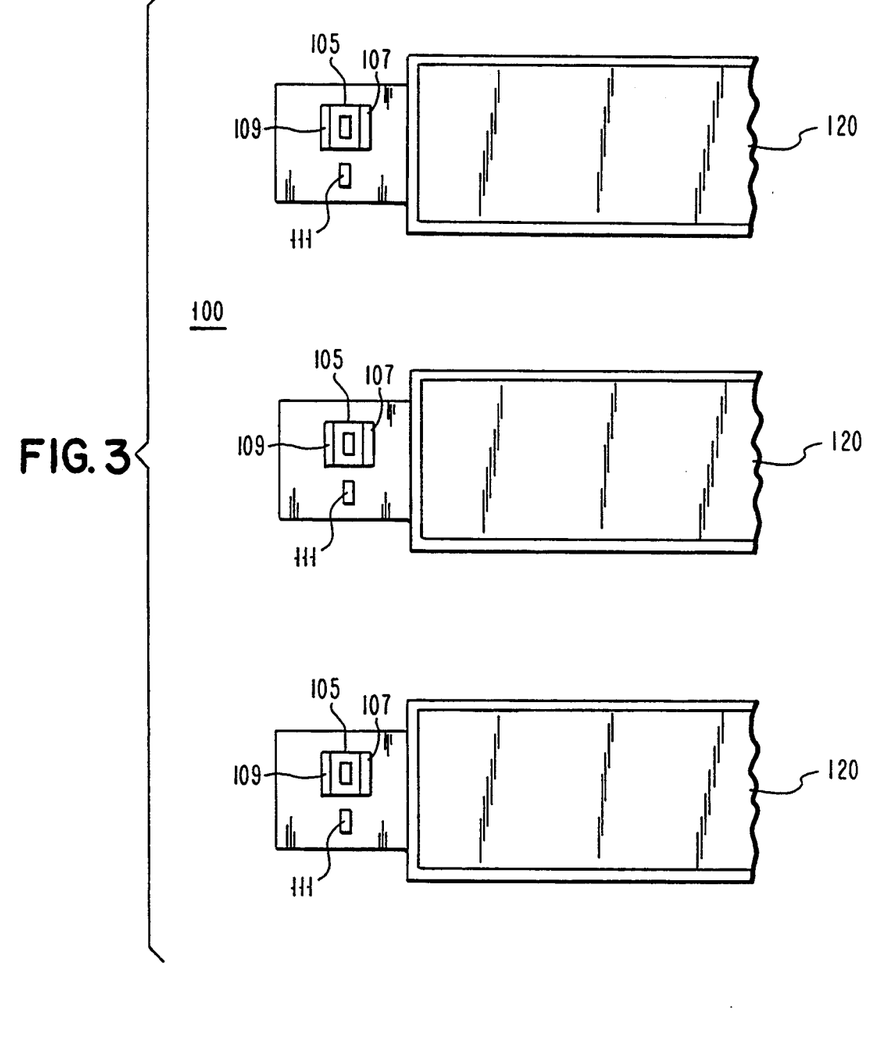
FIG. 3 illustrates a top view of an alternate embodiment of tile present invention.
Figure 4:
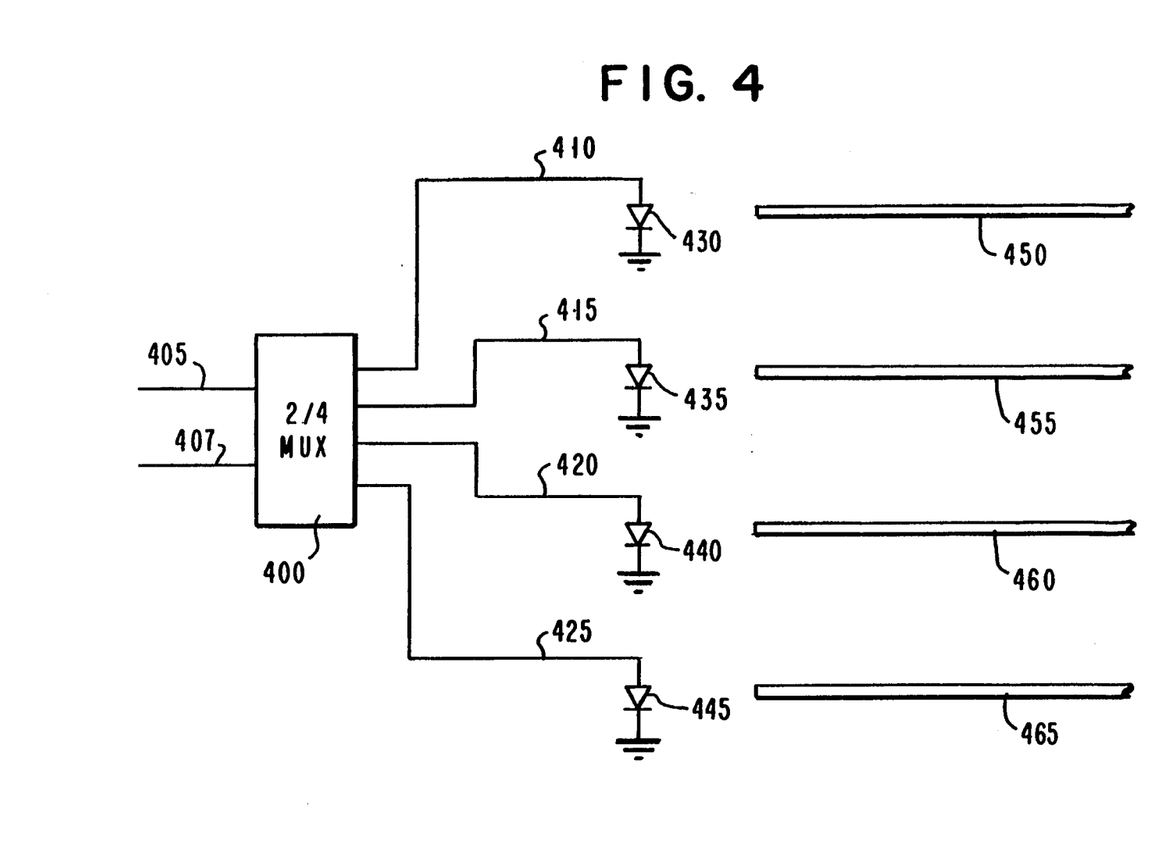
FIG. 4 illustrates a block diagram of an alternate embodiment of the present invention.

FIG. 3 illustrates that tile device of FIG. 1 may be replicated as a series of devices in a substrate 100 having a series of optical fibers, 1 optical fiber for each semiconductor laser device. The formation of such a series of optical devices is inexpensive because the laser structure is formed by using planar semiconductor device fabrication methods. The semiconductor laser devices of FIG. 3 can be connected to other electronic devices to form an electro-optic device. For example, the laser devices illustrated in FIG. 3 can be connected to an electronic logical multiplexer to form an electro-optic device for controlling the operation of the multiple laser devices and therefore controlling the transmission of light into multiple optical fibers as shown in FIG. 4. FIG. 4 illustrates a 2 to 4 multiplexer 400 in which electrical signals representing digital data on input lines 405 and 407 are converted into voltage levels on output lines 410, 415, 420 and 425. Output lines 410, 415, 420 and 425 are connected to laser diodes 430, 435, 440, and 445 respectively. Laser structures 430, 435, 440, and 445 respectively have a common electrode connected to ground. Electrical signals as inputs to the multiplexer generate voltages on the outputs to the multiplexer which control the current passing through the individual laser structures. The output voltages control the current through the laser device according to an exponential, diode type, current-voltage relationship. When current is passed through the individual laser structure, the light from that laser structure is coupled into the optical fiber (450, 455, 460, and 465 respectively) associated with that laser structure. In this way, electrical signals are converted into optical signals and are transmitted through the optical fibers aligned to the optical cavity of the respective laser device on the substrate.

The formation of the semiconductor laser device shown in FIG. 1 is accomplished by a process which initiates with growing an indium phosphide (or aluminum indium arsenide) heavily doped p+ layer on an indium phosphide substrate through conventional semiconductor technique such as metal-organic vapor deposition or molecular beam epitaxy. This step is followed by the growth of a gallium indium arsenide or a gallium indium arsenide phosphide layer having a thickness of few half-wavelenghts (approximately a few microns). This layer is preferably intrinsic, however, it can be either lightly doped n type or lightly doped p type. Light doping is in the range of approximately $10^{16}/cm^3$ to $10^{17}/cm^3$. Once the intrinsic region or optical cavity has been deposited, a heavily doped aluminum indium arsenide layer or indium phosphide layer is deposited. The doping of this layer is high, and n-type doping can be accomplished using silicon as a dopant. The concentration of doping for the p+ layer is approximately $5 \times 10^{18}/cm^3$ to $10^{20}/cm^3$. The concentration of the n+ doped region is approximately $5 \times 10^{18}/cm^3$ to $10^{20}/cm^3$. Once the p+, intrinsic, and n+ layers have been deposited, the facets of the semiconductor laser are formed. The facets of the semiconductor laser are formed by an anisotropic etch which preferentially etches the layers along planes determined by lithography. Such an etch generates a low damage region where recombination is low. The preferential etch can utilize both chemical-assisted ion beam etching or electron cyclotron resonance etching.

Once the facets of the laser have been etched, the Bragg reflectors are deposited. For GaAs active regions, the Bragg reflectors are deposited as a series of depositions of aluminum gallium arsenide of two different mole fractions. In particular, a first quarter wave layer of low aluminum arsenide mole fraction gallium aluminum arsenide is deposited over the surface of the laser structure and then a quarter wave layer of high aluminum arsenide mole fraction gallium aluminum arsenide is deposited over the first quarter wave layer. This process is repeated approximately twenty times to give twenty periods of the periodic structure. Once the Bragg reflectors have been formed, then a groove 122 is etched into the substrate. The groove 122 is wide and deep enough to accommodate the diameter of the fiber optic fiber. Typical optical fibers can have a diameter of as much as approximately 100 microns. The groove 122 is etched so that the receiving end of the optical fiber 123 is in parallel with the Bragg reflector 107. The groove 122 aligns the optical fiber to the laser structure. After the groove has been etched, contacts 111 and 113 are deposited. Subsequently, the optical fiber is placed in the groove 122 to complete the fabrication of the laser structure. Many individual laser structures can be integrated into conventional electronic structures to form devices which process signals in either electrical or optical form. Such integration is inexpensive because the optical devices are formed with conventional planar semiconductor fabrication methods.

While this invention has been particularly described and illustrated with reference to particular embodiments thereof, it will be understood by those skilled in the art that changes in the above description or illustration may be made with respect to former detail without departing from the spirit or scope of the invention.

We claim:

1. A low power single mode edge emitting semiconductor laser device, comprising:
   an optical cavity between two parallel facing facets, each of said facets being covered with a Bragg reflector, said optical cavity being disposed between an n-type conductive layer and a p-type conductive layer on a substrate;
   said optical cavity, n-type, and p-type layers forming a p-i-n device wherein said p-i-n device conducts electrical current through said optical cavity in a direction substantially parallel to said facets resulting in reflection of light by said Bragg reflectors back and forth in said optical cavity between said facets in a single mode of oscillation and emission of single mode light from said optical cavity through said Bragg reflector covering a first one of said facets
   said optical cavity having a length between said facets that is no greater than approximately ten times the wavelength of said emitted single mode light,
   whereby low power operation is achieved because said cavity is no longer than 10 wavelengths of said single mode light and because said electrical current is not conducted through said Bragg reflectors.

2. A laser device, as in claim 1, and further comprising:
   a groove in said substrate adjacent to said optical cavity for aligning an end of an optical fiber to said first facet for receiving said emitted single mode light.

3. A laser device, as in claim 2, wherein:
   said groove extends to within 25 microns from said Bragg reflector covering said first facet, for aligning said end of said optical fiber to within 25 microns from said Bragg reflector covering said first facet.

4. A laser device, as in claim 3, wherein:
   said groove is positioned for aligning said first facet to a central area of said end of said optical fiber.

5. A laser device, as in claim 1, and further comprising:
   circuit means integrated on said substrate for receiving an electrical signal and controlling current flow through said optical cavity of said p-i-n device in accordance with said received electrical signal,
   whereby said single mode light emitted from said optical cavity varies in accordance with said received electrical signal.

6. A laser device, as in claim 5, and further comprising:
   a groove in said substrate adjacent to said optical cavity for aligning an end of an optical fiber to said first facet for receiving said emitted single mode light.

7. A laser device, as in claim 6, wherein:
   said groove extends to within 25 microns from said Bragg reflector covering said first facet, for aligning said end of said optical fiber to within 25 microns from said Bragg reflector covering said first facet.

8. A laser device, as in claim 1, wherein said p-i-n device is one of a plurality of substantially identical p-i-n devices on said substrate.

9. A laser device, as in claim 8, and further comprising for each one of said plurality of p-i-n devices:
   a groove in said substrate adjacent to said optical cavity of said one p-i-n device for aligning an end of an optical fiber to said first facet of said one p-i-n device for receiving said single mode light emitted from said Bragg reflector covering said first facet.

10. A laser device, as in claim 9, and further comprising for each one of said plurality of p-i-n devices:
    circuit means integrated on said substrate for receiving an electrical signal and controlling current flow through said optical cavity of said one p-i-n device in accordance with said received electrical signal,
    whereby said single mode light emitted from said optical cavity of said one p-i-n device varies in accordance with said received electrical signal.

11. A laser device, as in claim 1, wherein:
    said facets have been formed by chemical-assisted ion beam etching or electron cyclotron resonance etching at a bias level small enough to minimize surface damage.

12. A laser device, as in claim 1, wherein:
    each of said Bragg reflectors comprises a stack of alternating layers of two different insulating materials having different indexes of refraction, each of said layers in said stack having a thickness of approximately one quarter of the wavelength of said single mode light emitted from said optical cavity.

13. A laser device, as in claim 12, wherein:
    said stack of alternating layers of insulating materials comprises at least 10 layers.

14. A laser device, as in claim 12, wherein:
    said Bragg reflector covering said first facet consists of a smaller stack of insulating materials than said Bragg reflector covering the other one of said facets.

15. A laser device, as in claim 12, wherein:
    said layers of insulating material have been formed on each of said facets using a directional deposition technique with said substrate oriented at a shallow angle of between 0.5 and 20 degrees with respect to the direction of deposition.

16. A laser device, as in claim 15, wherein:
    said directional deposition technique is selected from a group of techniques which includes chemical vapor deposition, evaporation, sputtering and ion-assisted deposition.

17. A laser device, as in claim 1, wherein said p-i-n device is a mesa structure formed by anisotropic etching.

* * * * *